United States Patent
Kim et al.

(10) Patent No.: US 7,884,364 B2
(45) Date of Patent: Feb. 8, 2011

(54) ARRAY SUBSTRATE, METHOD OF MANUFACTURING THE SAME, AND METHOD OF REPAIRING LINE IN THE SAME

(75) Inventors: Eun-Hong Kim, Daegu (KR); Bong-Mook Yim, Seoul (KR); Jung-Hwan Kim, Tongyeong-si (KR)

(73) Assignee: LG Display Co., Ltd., Seoul (KR)

( * ) Notice: Subject to any disclaimer, the term of this patent is extended or adjusted under 35 U.S.C. 154(b) by 462 days.

(21) Appl. No.: 11/905,491

(22) Filed: Oct. 1, 2007

(65) Prior Publication Data
US 2008/0135857 A1 Jun. 12, 2008

(30) Foreign Application Priority Data
Dec. 12, 2006 (KR) ...................... 10-2006-0126167

(51) Int. Cl.
*H01L 29/00* (2006.01)
*G02F 1/1345* (2006.01)

(52) U.S. Cl. .................. 257/59; 257/72; 257/E27.131; 349/54; 349/55

(58) Field of Classification Search ................... 257/59, 257/72, E27.131; 349/54, 55, 43, 87, 139, 349/142, 192
See application file for complete search history.

(56) References Cited
U.S. PATENT DOCUMENTS

| | | | | |
|---|---|---|---|---|
| 6,441,401 B1 * | 8/2002 | Jung et al. | ..................... | 257/72 |
| 6,671,010 B2 * | 12/2003 | Kwon et al. | .................. | 349/43 |
| 2006/0071212 A1 * | 4/2006 | Song et al. | ..................... | 257/59 |

FOREIGN PATENT DOCUMENTS

| CN | 1450385 | 10/2003 |
|---|---|---|
| KR | 10-2005-0105591 | 11/2005 |

* cited by examiner

*Primary Examiner*—Jerome Jackson, Jr.
*Assistant Examiner*—Yu Chen
(74) *Attorney, Agent, or Firm*—McKenna Long & Aldridge LLP

(57) ABSTRACT

An array substrate includes a substrate, a gate line on the substrate, a data line crossing the gate line to define a pixel region, a thin film transistor connected to the gate and data lines, a pixel electrode in the pixel region, and a common electrode including first, second, third, fourth and fifth portions, wherein the first and second portions are disposed at both sides of the data line, each of the third and fourth portions is connected to the first and second portions, and the fifth portion is connected to the second portion and is extended into a next pixel region adjacent to the pixel region.

4 Claims, 14 Drawing Sheets

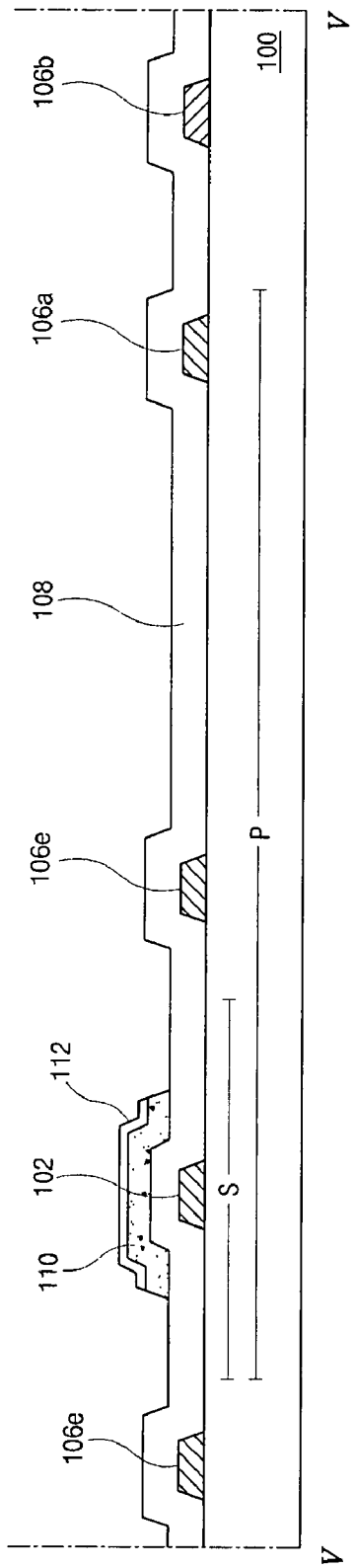
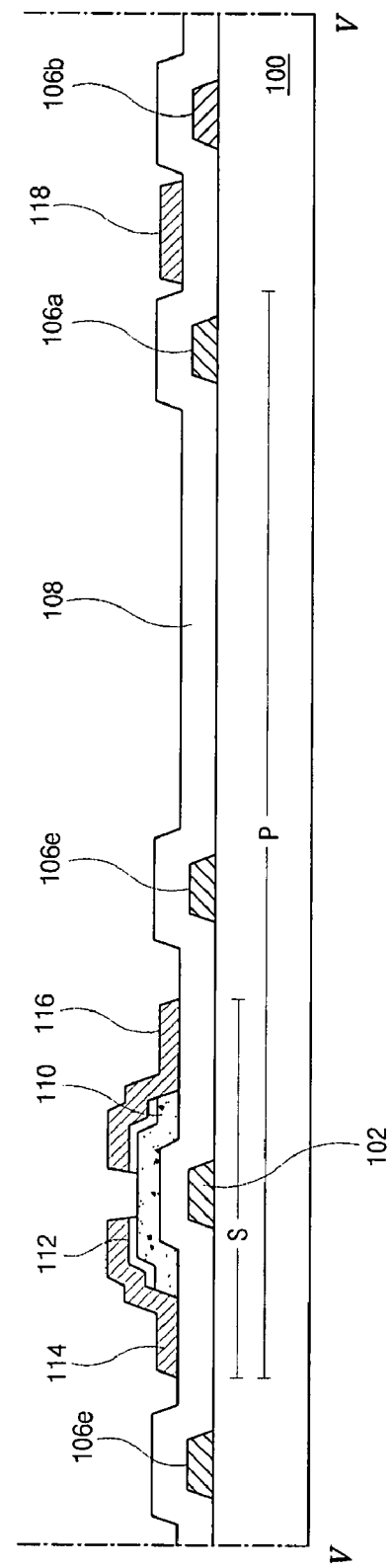

US 7,884,364 B2

ARRAY SUBSTRATE, METHOD OF MANUFACTURING THE SAME, AND METHOD OF REPAIRING LINE IN THE SAME

This application claims the benefit of Korean Patent Application No. 10-2006-0126167, filed on Dec. 12, 2006, which is hereby incorporated by reference for all purposes as if fully set forth herein.

BACKGROUND OF THE INVENTION

1. Field of the Invention

Embodiments of the present invention relate to a liquid crystal display device, and more particularly, to an array substrate, a method of manufacturing the same, and a method of repairing a line in the same.

2. Discussion of the Related Art

Liquid crystal display (LCD) devices are driven based on optical anisotropy and polarization characteristics of a liquid crystal material. Liquid crystal molecules have a long and thin shape, and the liquid crystal molecules are regularly arranged along in an alignment direction. Light passes through the LCD device along the long and thin shape of the liquid crystal molecules. The alignment of the liquid crystal molecules depends on the intensity or the direction of an electric field applied to the liquid crystal molecules. By controlling the intensity or the direction of the electric field, the alignment of the liquid crystal molecules is controlled to display images.

An LCD device of a related art will be described with reference to FIGS. 1 and 2 of the accompanying drawings.

FIG. 1 is a schematic cross-sectional view of an LCD device according to the related art, and FIG. 2 is a plan view of an array substrate for an LCD device according to the related art.

As shown in FIG. 1 and FIG. 2, the LCD device according to the related art includes a lower substrate 22 and an upper substrate 50, with a liquid crystal layer 14 is interposed between the lower substrate 22 and the upper substrate 50. Thin film transistors T, pixel electrodes 46, gate lines 13 and data lines 42 are formed on the lower substrate 22. A black matrix 52, red, green and blue color filters 54a, 54b and 54c and a common electrode 56 are formed on the upper substrate 50. The lower substrate 22 including the thin film transistors T, the pixel electrodes 46, the gate lines 13 and the data lines 42 may be referred to as an array substrate. The upper substrate 50 including the black matrix 52, the color filters 54a, 54b and 54c, and the common electrode 56 may be referred to as a color filter substrate.

The gate lines 13 and the data lines 42 cross each other to define pixel regions P. The thin film transistors T are disposed near respective crossings of the gate and data lines 13 and 42 and are arranged in a matrix.

Each pixel electrode 46 is disposed at each pixel region P and is formed of a transparent conductive material such as indium tin oxide (ITO). The pixel electrodes 46 are connected to the thin film transistors T, respectively. The pixel electrodes 46 are also arranged in a matrix.

Each thin film transistor T includes a gate electrode 30, an active layer 34, and source and drain electrodes 36 and 38. A gate insulating layer 32 is disposed between the gate electrode 30 and the active layer. A passivation layer 40 is disposed between the thin film transistor T and the pixel electrode 46. The gate electrode 30 is connected to the gate line 13 and is supplied with pulse signals from the gate line 13. The source electrode 36 is connected to the data line 42 and is supplied with data signals from the data line 42. The data signals are provided to the pixel electrode 46 through the drain electrode 38 that is spaced apart from the source electrode 36 and that is connected to the pixel electrode 46. The active layer 34 is disposed between the gate electrode 30 and the source and drain electrodes 36 and 38.

The elements of the array substrate may be formed by photolithographic processes. During these processes, the gate line and the data line may be open circuited due to particles generated on a surface of the substrate. In particular, because the data line is formed after other elements are formed, an open circuit is more likely to be formed in the data line than in the gate line

SUMMARY OF THE INVENTION

Accordingly, embodiments of the present invention are directed to an array substrate, a method of manufacturing the same and a method of repairing a line in the same that substantially obviates one or more problem due to limitations and disadvantages of the related art.

An advantage of embodiments of the invention is to provide an array substrate, a method of manufacturing the same and a method of repairing a line in the same that solve open problems of a line.

Another advantage is to provide an array substrate, a method of manufacturing the same and a method of repairing a line in the same that produce uniform and high quality images by providing a common signal to all pixels.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the array substrate includes a substrate, a gate line on the substrate, a data line crossing the gate line to define a pixel region, a thin film transistor connected to the gate and data lines, a pixel electrode in the pixel region, and a common electrode including first, second, third, fourth and fifth portions, wherein the first and second portions are disposed at both sides of the data line, each of the third and fourth portions is connected to the first and second portions, and the fifth portion is connected to the second portion and is extended into a next pixel region adjacent to the pixel region. It is to be understood that both the foregoing general description and the following detailed description are exemplary and explanatory and are intended to provide further explanation of the invention as claimed.

In another aspect, a method of manufacturing an array substrate includes forming a gate line on a substrate, forming a data line crossing the gate line to define a pixel region, forming a thin film transistor connected to the gate and data lines, forming a pixel electrode in the pixel region, and forming a common electrode including first, second, third, fourth and fifth portions, wherein the first and second portions are disposed at both sides of the data line, each of the third and fourth portions is connected to the first and second portions, and the fifth portion is connected to the second portion and is extended into a next pixel region adjacent to the pixel region.

In another aspect, a method of manufacturing an array substrate includes forming a gate line, a gate electrode and a common line on a substrate, wherein the common line includes first, second, third, fourth and fifth portions, forming a gate insulating layer on the gate line, the gate electrode and the common line, forming an active layer and ohmic contact layers on the gate insulating layer over the gate electrode, forming a data line, a source electrode and a drain electrode, wherein the data line crosses the gate line to define a pixel region, and the source and drain electrodes are spaced apart over the ohmic contact layers, forming a passivation layer on the data line, the source electrode and the drain electrode, wherein the passivation layer includes a contact hole exposing the drain electrode, and forming a pixel electrode in the pixel region and connected to the drain electrode, wherein the first and second portions are disposed at both sides of the data line, each of the third and fourth portions is connected to the first and second portions, and the fifth portion is connected to the second portion and is extended into a next pixel region adjacent to the pixel region.

In another aspect, a method of repairing a data line having an open portion in an array substrate, wherein the array substrate includes a substrate, a gate line on the substrate, the data line crossing the gate line to define a pixel region, a thin film transistor connected to the gate and data lines, a pixel electrode in the pixel region, and a common electrode including first, second, third, fourth and fifth portions, wherein the first and second portions are disposed at both sides of the data line, each of the third and fourth portions is connected to the first and second portions such that the open portion is disposed between the third and fourth portions, and the fifth portion is connected to the second portion and is extended into a next pixel region adjacent to the pixel region, includes welding the third and fourth portions with the data line, and cutting off the second portion from the third and fourth portions, so that a first part of the data line at one side of the open portion is electrically connected to a second part of the data line at the other side of the open portion through the third portion, the first portion, and the fourth portion.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 7A to 7D are cross-sectional views illustrating an array substrate, and a process of manufacturing the same according to the second embodiment of the present invention;

DETAILED DESCRIPTION OF THE ILLUSTRATED EMBODIMENTS

Reference will now be made in detail to embodiments of the present invention, examples of which are illustrated in the accompanying drawings.

Figure 1:
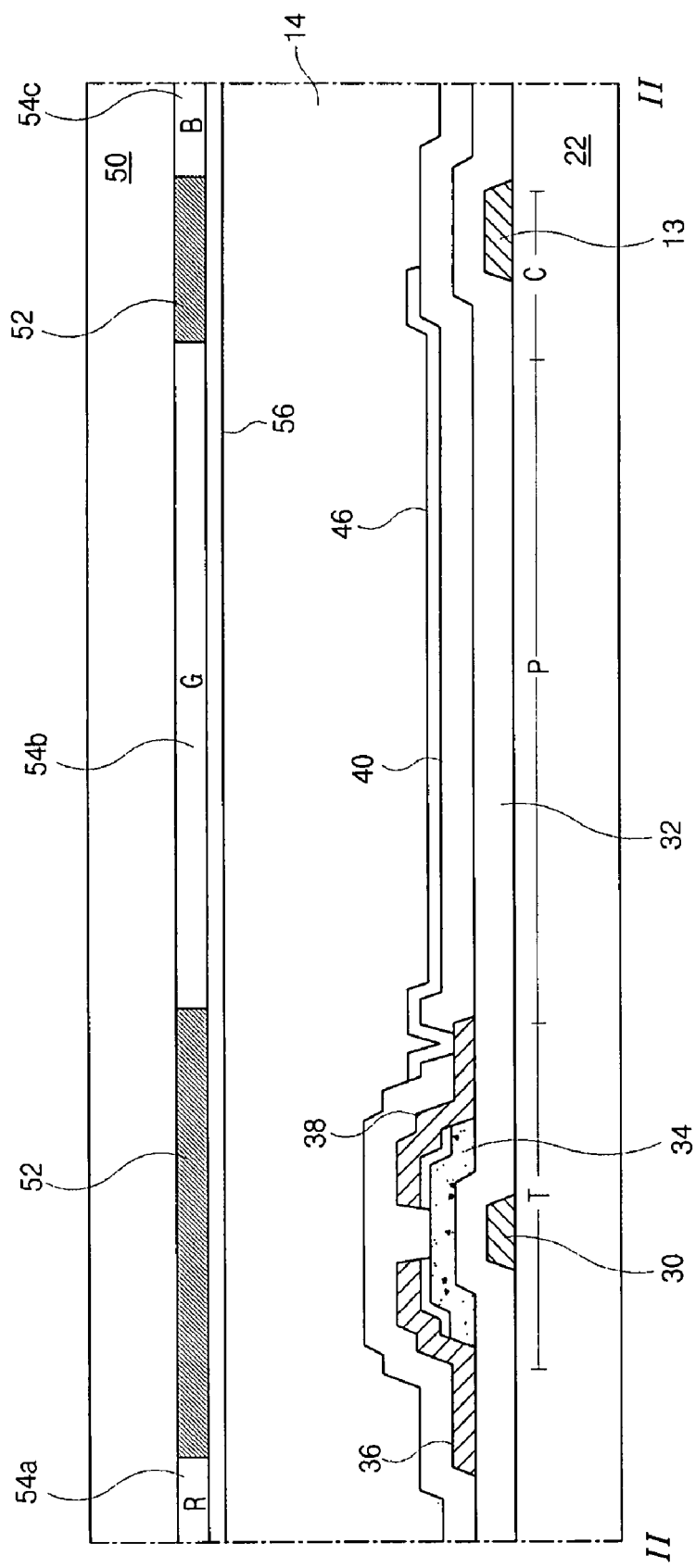
FIG. 1 is a schematic cross-sectional view of an LCD device according to the related art.
Figure 2:
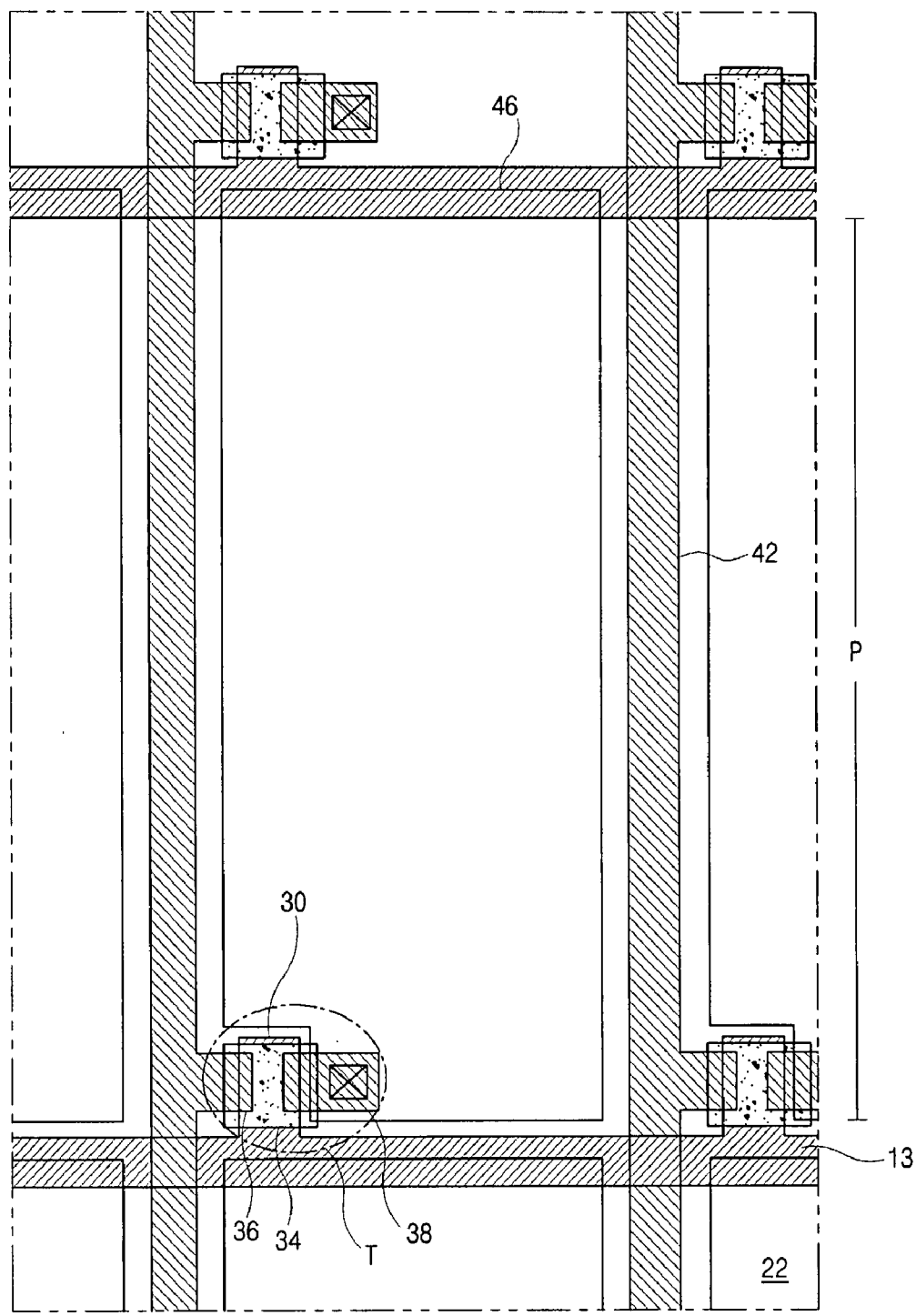
FIG. 2 is a plan view of an array substrate for an LCD device according to the related art.
Figure 3:
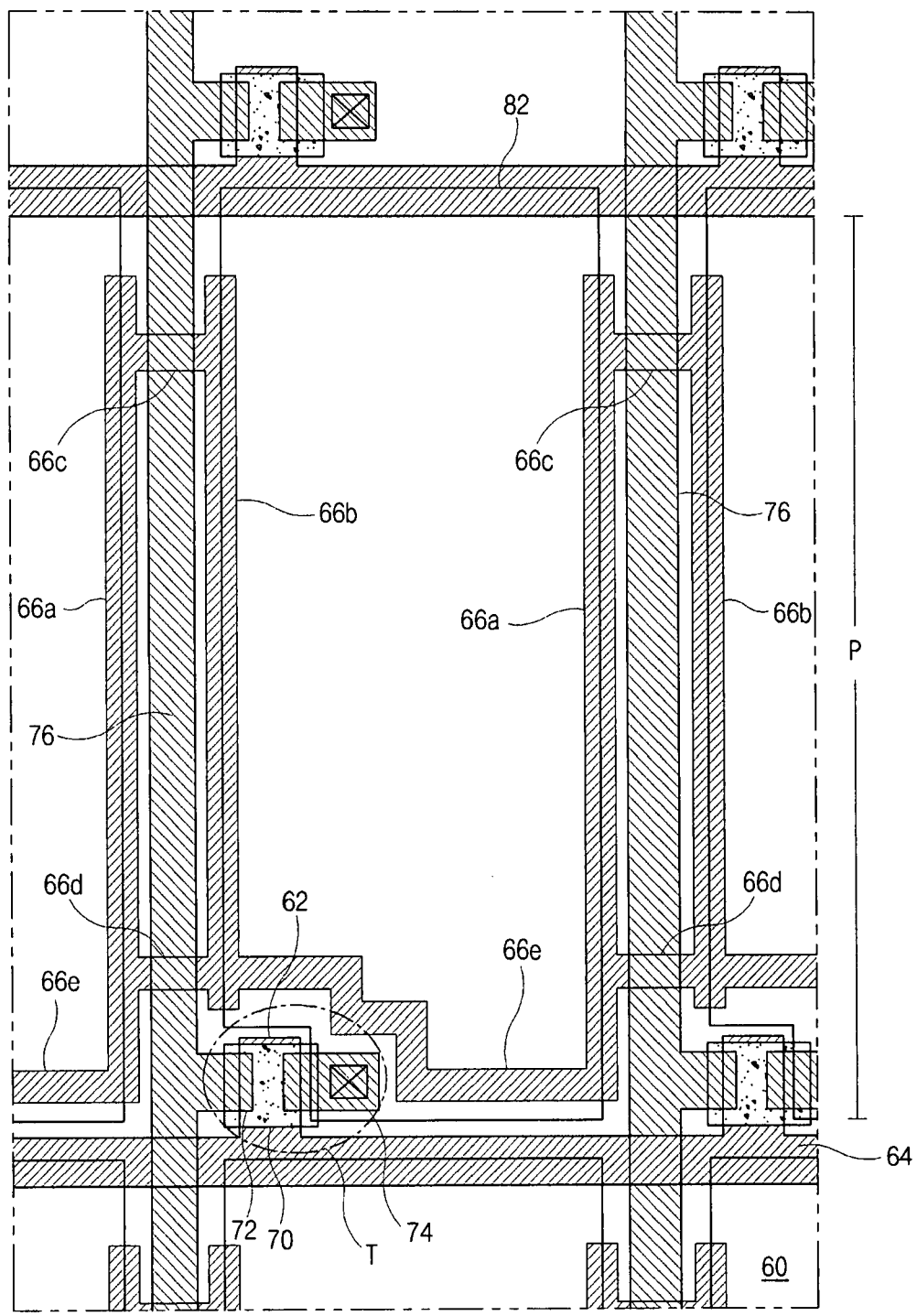
FIG. 3 is a plan view of an array substrate for an LCD device according to a first embodiment of the present invention.

FIG. 3 is a plan view of an array substrate for an LCD device according to a first embodiment of the present invention.

In FIG. 3, gate lines 64 are formed on a substrate 60 along a first direction, and data lines 76 are formed along a second direction. The gate lines 64 and the data lines 76 cross each other to define pixel regions P.

A thin film transistor T is formed near by each crossing point of the gate and data lines 64 and 76. A pixel electrode 82 is formed at each pixel region P. The thin film transistor T includes a gate electrode 62, an active layer 70, a source electrode 72 and a drain electrode 74. The gate electrode 62 is connected to the gate line 64 and receives scanning signals from the gate line 64. The active layer 70 is formed over the gate electrode 62. The source electrode 72 is connected to the data line 76 and receives image signals from the data line 76. The drain electrode 74 is spaced apart from the source electrode 72 and is connected to the pixel electrode 82.

A common line is further formed. The common line includes a first portion 66a, a second portion 66b, a third portion 66c, a fourth portion 66d, and a fifth portion 66e corresponding to each pixel region P. The first portion 66a and the second portion 66b are parallel to the data line 76 and positioned at both sides of the data line 76, respectively, such that the data line 76 is disposed between the first and second portions 66a and 66b. The third portion 66c and the fourth portion 66d are parallel to the gate line 64 and cross the data line 76 in upper and lower areas of the pixel region P, respectively. The third and fourth portions 66c and 66d connect the first portion 66a and the second portion 66b. The fifth portion 66e connects the second portion 66b and another first portion 66a, i.e., a first portion of a next pixel region, across the pixel region P. The fifth portion 66e may be disposed near by the thin film transistor T. Therefore, the first portion 66a, the second portion 66b and the fifth portion 66e have one-united shape at each pixel region P. The common line 66a, 66b, 66c, 66d and 66e may be used as a repair line when the data line 76 is open.

Figure 4:
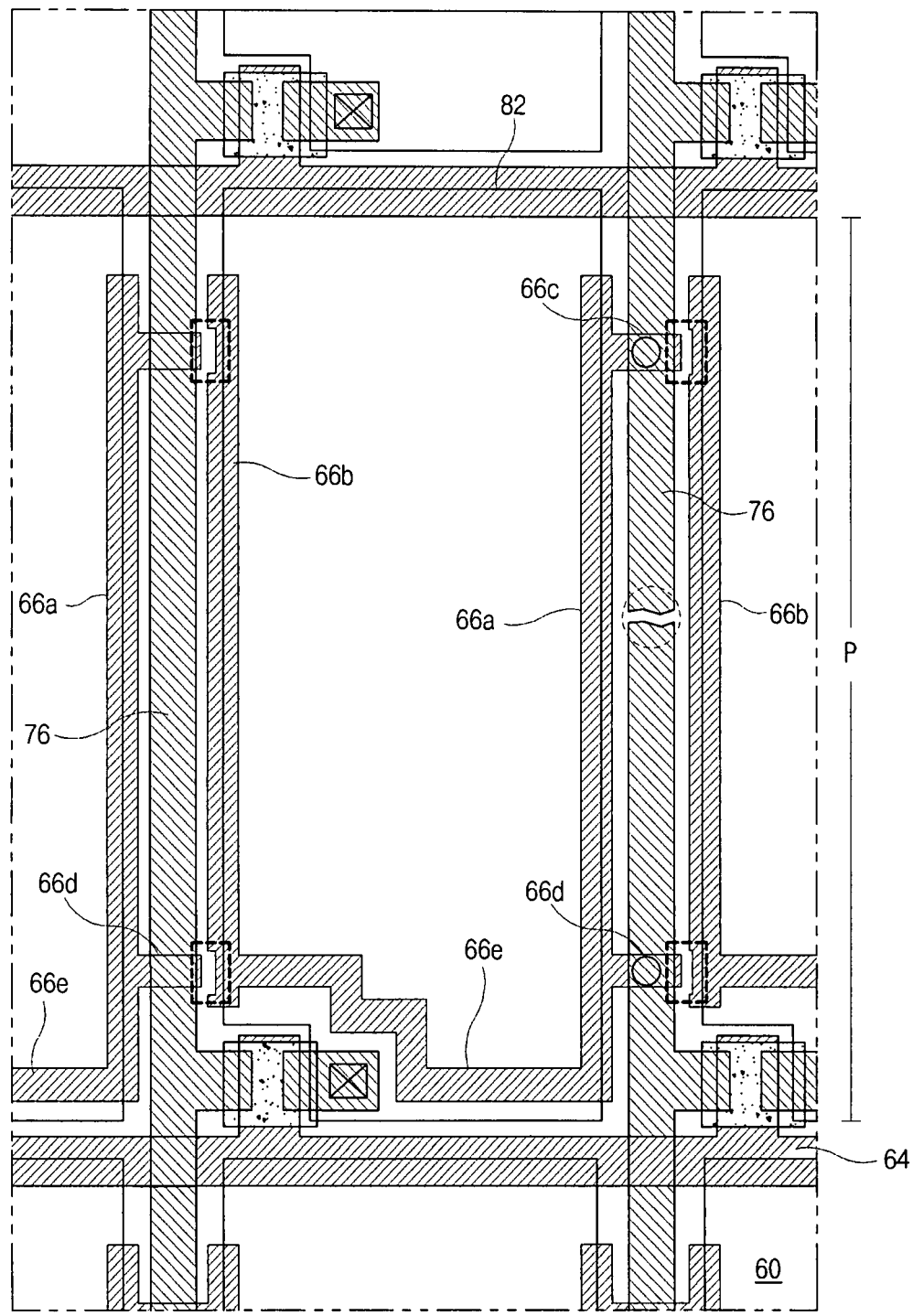
FIG. 4 is a plan view illustrating a method of repairing an open circuit in a data line in an LCD device according to a first embodiment of the present invention.

In the first embodiment of the present invention, a method of repairing a data line will be explained with reference to FIG. 4. FIG. 4 is a plan view of illustrating a method of repairing a data line when the data line is open in the present invention.

In FIG. 4, when one of the data lines 76 is open, the third and fourth portions 66c and 66d of the common line crossing the opened data line 76 are welded using a laser and connected to the opened data line 76. The second portion 66b is disconnected from the third and fourth portions 66c and 66d connected to the opened data line 76 using a laser. Further, in a previous pixel region P, which is adjacent to the third and fourth portions 66c and 66d connected to the opened data line 76, the second portion 66b is also disconnected from the third and fourth portions 66c and 66d.

Accordingly, the third and fourth portions 66c and 66d connected to the opened data line 76 and the first portion 66a connected to the third and fourth portions 66c and 66d are used as a repair line.

The first portion 66a electrically connected to the opened data line 76 may be disconnected from the fifth portion 66e of the previous pixel region P to decrease a resistance of the repair line. Because the first portion 66a and the fifth portion 66e are connected over the pixel electrode 82, the first portion 66a or the fifth portion 66e may be shorted with the pixel electrode 82 when cutting off the first portion 66a and the fifth portion 66e of the previous pixel region P. Therefore, the second portion 66b may be disconnected from the third and fourth portions 66c and 66d between the data line 76 and the second portion 66b in the previous pixel region P, where there is no pixel electrode.

In the LCD device according to the first embodiment, image signals, which may be referred to as data signals, can be transmitted through an upper part of the opened (open circuited) data line 76, the third portion 66c, the first portion 66a, the fourth portion 66d, and a lower part of the opened data line 76 in order.

In the first embodiment, a common signal cannot be provided to the previous pixel region P, where the repair line is disposed, because a part of the common line in the previous pixel region P is separated from others. A second embodiment of the present invention has a structure to solve the above-mentioned problem.

Figure 5:
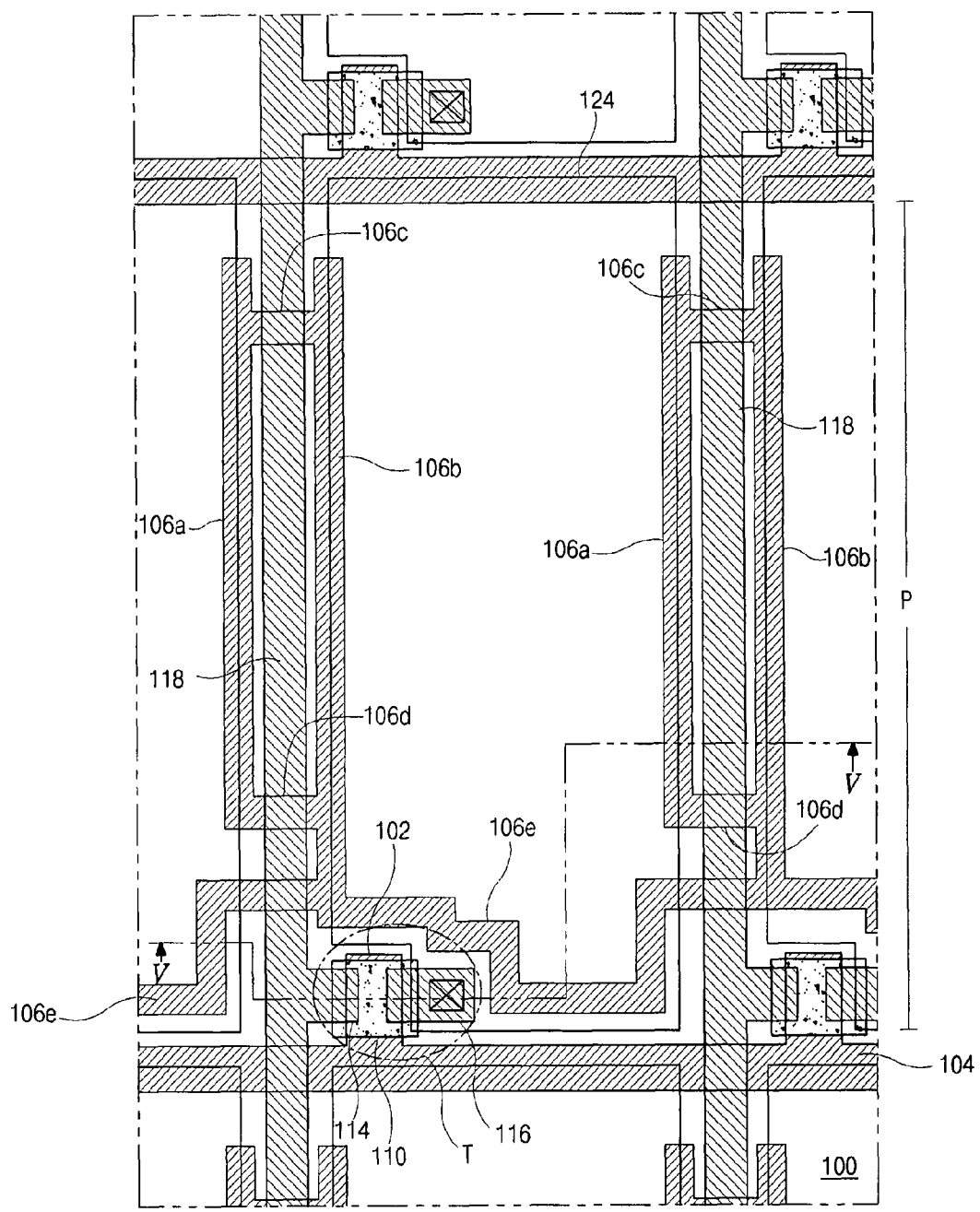
FIG. 5 is a plan view of an array substrate for an LCD device according to a second embodiment of the present invention.

FIG. 5 is a plan view of an array substrate for an LCD device according to a second embodiment of the present invention.

In FIG. 5, gate lines 104 are formed on a substrate 100 along a first direction, and data lines 118 are formed along a second direction. The gate lines 104 and the data lines 118 cross each other to define pixel regions P.

A thin film transistor T is formed near by each crossing point of the gate and data lines 104 and 118. A pixel electrode 124 is formed at each pixel region P. The thin film transistor T includes a gate electrode 102, an active layer 110, ohmic contact layers (not shown), a source electrode 114 and a drain electrode 116. The gate electrode 102 is connected to the gate line 104 and receives scanning signals from the gate line 104. The active layer 110 and the ohmic contact layers are sequentially formed over the gate electrode 102. The source electrode 114 and the drain electrode 116 are formed over the ohmic contact layers. The source electrode 114 is connected to the data line 118 and receives image signals from the data line 118. The drain electrode 116 is spaced apart from the source electrode 114 and is connected to the pixel electrode 124.

A common line is further formed. The common line includes a first portion 106a, a second portion 106b, a third portion 106c, a fourth portion 106d, and a fifth portion 106e corresponding to each pixel region P. The first portion 106a and the second portion 106b are parallel to the data line 118 and positioned at both sides of the data line 118 such that the data line 118 is disposed between the first and second portions 106a and 106b. The third portion 106c and the fourth portion 106d are parallel to the gate line 104 and cross the data line 118 in upper and lower areas of the pixel region P in the context of the figure, respectively. The third and fourth portions 106c and 106d connect the first portion 106a and the second portion 106b. The fifth portion 106e crosses the pixel region P along the first direction and contacts the second portion 106b in the pixel region P. The fifth portion 106e is also connected to another second portion 106b of a next pixel region P. The fifth portion 106e may be disposed near by the thin film transistor T.

When a liquid crystal panel is completely manufactured and there is no opened data line, the first, second, third, fourth and fifth portions 106a, 106b, 106c, 106d and 106e function as a common line receiving a common signal. When one of the data lines 118 is open, the first, third and fourth portions 106a, 106c and 106d are used as a repair line, and the second and fifth portions 106b and 106e are used substantially as a common line.

Figure 6:
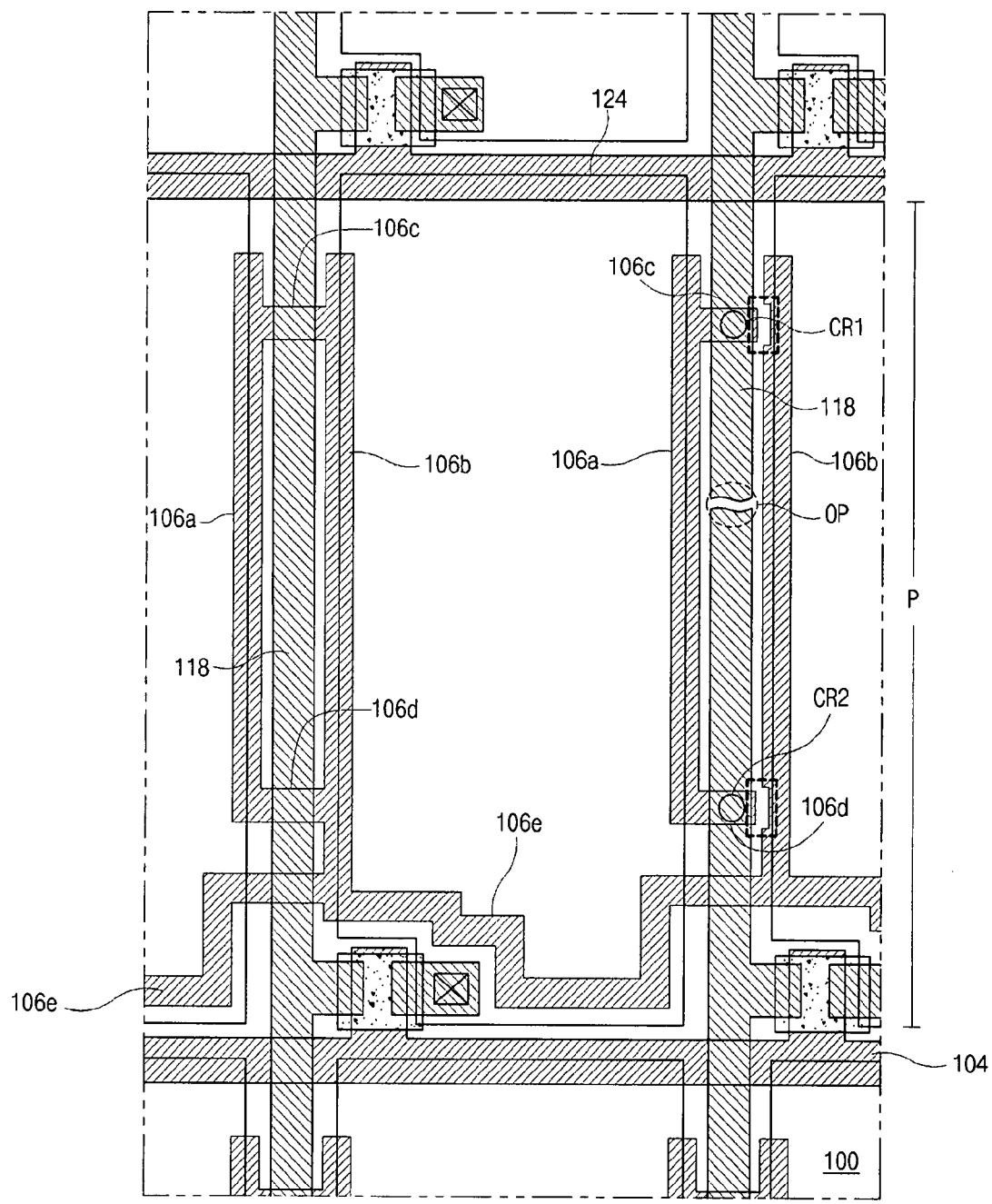
FIG. 6 is a plan view illustrating a method of repairing an open circuit in a data line in an LCD device according to a second embodiment of the present invention.

In the second embodiment of the present invention, a method of repairing a data line will be explained with reference to FIG. 6. FIG. 6 is a plan view of illustrating a method of repairing a data line when the data line is open in the second embodiment of the present invention.

In FIG. 6, when one of the data lines 118 is open, the third and fourth portions 106c and 106d, which are disposed at upper and lower parts of an open portion OP and cross the opened data line 118, are welded at crossing points CR1 and CR2 using a laser and connected to the opened data line 118. Then, the second portion 106b adjacent to the opened data line 118 is disconnected from the third and fourth portions 106c and 106d connected to the opened data line 118 using a laser. The third and fourth portions 106c and 106d, which are connected to the opened data line 118, and the first portion 106a, which is connected thereto, are electrically connected to the opened data line 118 and are separated from other portions of the common line. The disconnected second portion 106b is still connected to the fifth portion 106e of a previous pixel region P to the opened data line 118.

Accordingly, the third and fourth portions 106c and 106d connected to the opened data line 118 and the first portion 106a connected to the third and fourth portions 106c and 106d are used as a repair line. In the previous pixel region P to the opened data line 118, the second portion 106b and the fifth portion 106e are used as a common line. The common signal can be transmitted to the previous pixel region P to the opened data line 118, and there is no difference between charging properties of the pixel region P and the previous pixel region P. Differences in an image can be minimized.

A method of manufacturing an array substrate for an LCD device according to the second embodiment will be described hereinafter with reference to FIGS. 7A to 7D. FIGS. 7A to 7D are cross-sectional views of illustrating an array substrate in process of manufacturing the same according to the second embodiment of the present invention. FIGS. 7A to 7D correspond to the line V-V of FIG. 5.

FIG. 7A shows first and second mask processes. In FIG. 7A, a pixel region P and a switching region S are defined on a substrate 100.

A first metallic material is deposited on the substrate 100 and patterned by a first mask process to thereby form a gate electrode 102 and a gate line 104 of FIG. 5. At the same time, a common line is formed. The gate electrode 102 corresponds to the switching region S, and the gate line 104 extends along a first side of the pixel region P. The common line includes first, second, third, fourth and fifth portions 106a, 106b, 106c of FIG. 5, 106d of FIG. 5 and 106e. The first and second portions 106a and 106b are disposed at opposite sides of the pixel region P adjacent to the first side of the pixel region P. The third and fourth portions 106c and 106d of FIG. 5 connect the first and second portions 106a and 106b adjacent to each other. The fifth portion 106e is connected to the second portion 106b and a second portion 106b of another pixel region adjacent to the pixel region P.

The first metallic material may be one or more selected from a conductive metallic group including chromium (Cr), molybdenum (Mo), tungsten (W), aluminum (Al), aluminum alloy such as aluminum nitride (AlNd), copper (Cu) and titanium (Ti).

A gate insulating layer 108 is formed substantially on an entire surface of the substrate 100 including the gate electrode 102 and the gate line 104 of FIG. 5.

Next, intrinsic amorphous silicon (a-Si:H) and impurity-doped amorphous silicon (n+a-Si:H) are deposited substantially on an entire surface of the substrate 100 including the gate insulating layer 108 and are patterned by a second mask process. Thus, an active layer 110 and ohmic contact layers 112 are formed on the gate insulating layer 108 over the gate electrode 102.

FIG. 7B shows a third mask process. In FIG. 7B, a second metallic material is deposited substantially on an entire surface of the substrate 100 including the active layer and the ohmic contact layers 112 and then is patterned by a third mask process to form source and drain electrodes 114 and 116 and a data line 118. The source and drain electrodes 114 and 116 are spaced apart from each other over the ohmic contact layers 112. The data line 118 extends along a second side of the pixel region P perpendicularly to the gate line 104 of FIG. 5. The data line 118 is connected to the source electrode 114. The second metallic material may be one or more selected from the above-stated conductive metallic group.

Figure 7C:
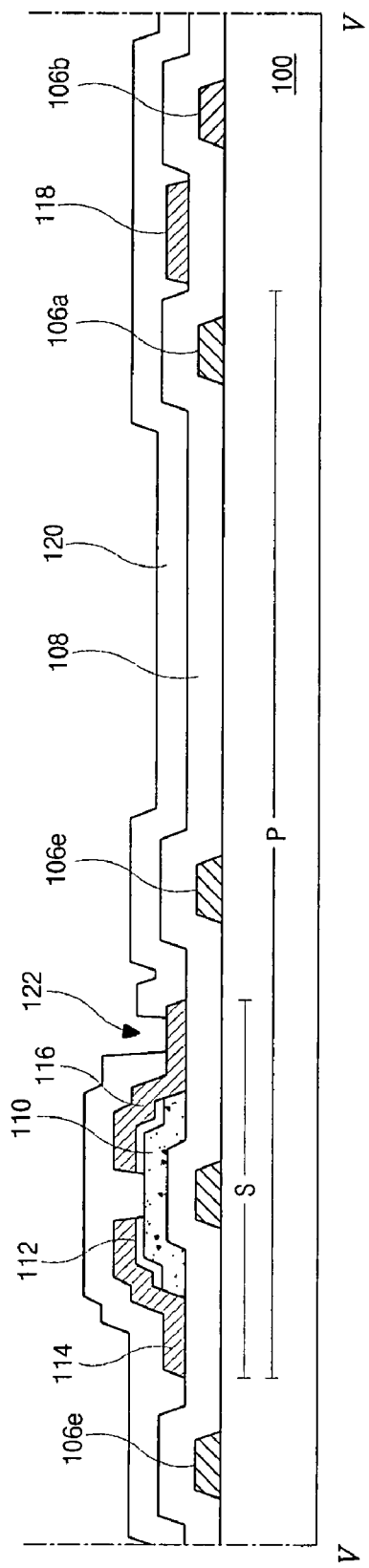

FIG. 7C shows a fourth mask process. In FIG. 7C, an organic material is applied to substantially an entire surface of the substrate 100 including the source and drain electrodes 114 and 116 and the data line 118 to form a passivation layer 120. The passivation layer 120 is patterned by a fourth mask process to form a drain contact hole 122 partially exposing the drain electrode 116. The organic material may be one or more selected from an organic material group including benzocyclobutene (BCB) and acrylic resin.

Figure 7D:
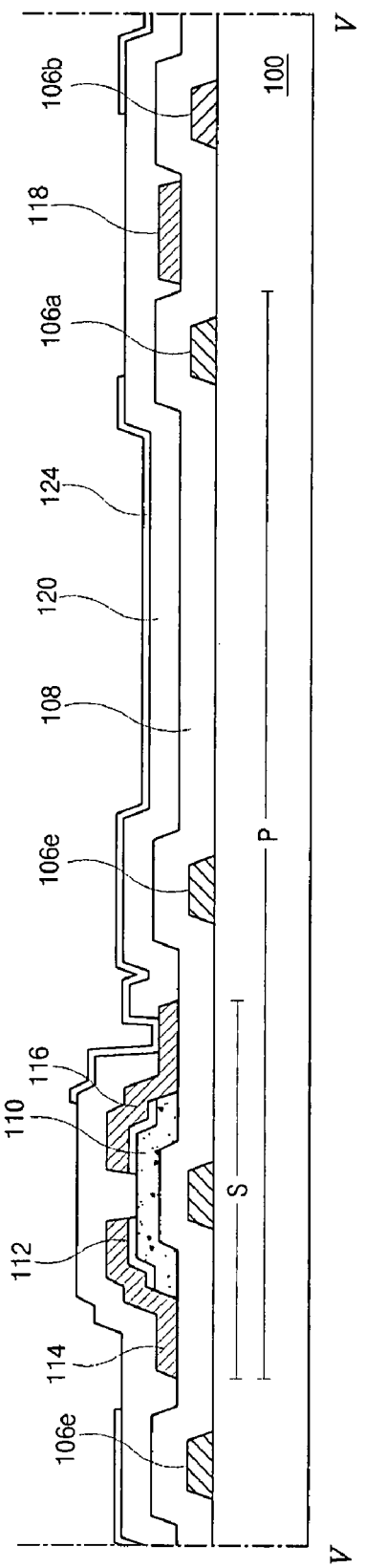

FIG. 7D shows a fifth mask process. In FIG. 7D, a transparent conductive material is deposited substantially on an entire surface of the substrate 100 including the passivation layer 120 and then patterned by a fifth mask process to form a pixel electrode 124. The pixel electrode 124 is disposed at the pixel region P. The pixel electrode 124 contacts the drain electrode 116 through the drain contact hole 122. The transparent conductive material may be one selected from a transparent conductive material group including indium zinc oxide (IZO) and indium tin oxide (ITO).

The array substrate for an LCD device can be manufactured through the above-mentioned five mask processes.

By decreasing the mask processes, manufacturing costs and time may be reduced to increase productivity.

Figure 8:
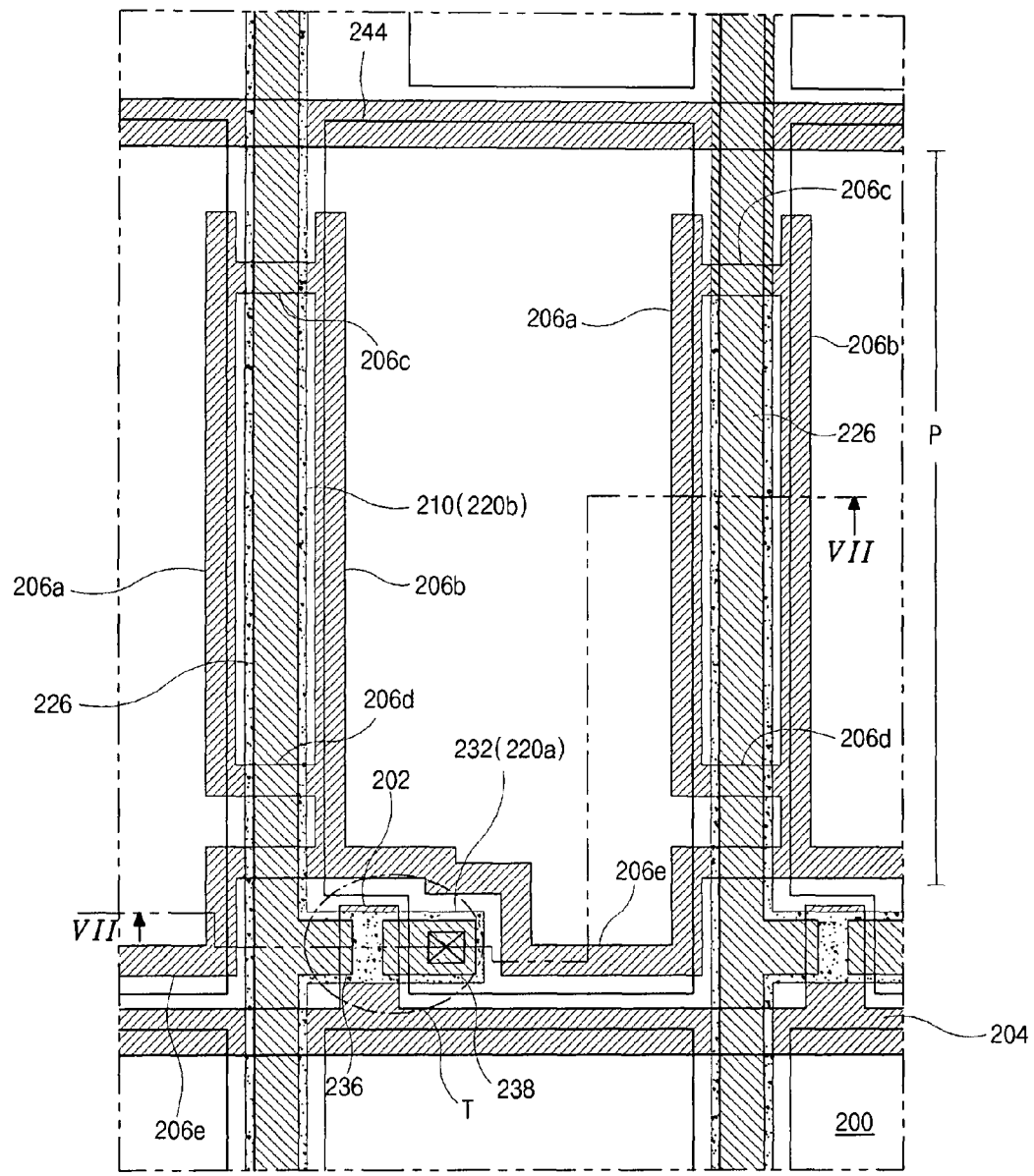
FIG. 8 is a plan view of an array substrate for an LCD device according to a third embodiment of the present invention.

FIG. 8 is a plan view of an array substrate for an LCD device according to a third embodiment of the present invention.

In FIG. 8, gate lines 204 are formed on a substrate 200 along a first direction, and data lines 226 are formed along a second direction. The gate lines 204 and the data lines 226 cross each other to define pixel regions P.

A thin film transistor T is formed near by each crossing point of the gate and data lines 204 and 226. A pixel electrode 244 is formed at each pixel region P. The thin film transistor T includes a gate electrode 202, an active layer 232, ohmic contact layers (not shown), a source electrode 236 and a drain electrode 238. The gate electrode 202 is connected to the gate line 204 and receives scanning signals from the gate line 204. The active layer 232 and the ohmic contact layers constitute a first semiconductor layer 220a and are sequentially formed over the gate electrode 202. The source electrode 236 and the drain electrode 238 are formed over the ohmic contact layers. The source electrode 236 is connected to the data line 226 and receives image signals from the data line 226. The drain electrode 238 is spaced apart from the source electrode 236 and is connected to the pixel electrode 244. A second semiconductor layer 220b is formed under the data line 226. The second semiconductor layer 220b extends from the first semiconductor layer 220a and includes an intrinsic amorphous silicon layer 210 and an impurity-doped amorphous silicon layer (not shown). The intrinsic amorphous silicon layer 210 is exposed beyond the data line 226.

A common line is further formed. The common line includes a first portion 206a, a second portion 206b, a third portion 206c, a fourth portion 106d, and a fifth portion 206e corresponding to each pixel region P. The first portion 206a and the second portion 206b are parallel to the data line 226 and positioned at both sides of the data line 226 such that the data line 226 is disposed between the first and second portions 206a and 206b. The third portion 206c and the fourth portion 206d are parallel to the gate line 204 and cross the data line 226 in upper and lower areas of the pixel region P in the context of the figure, respectively. The third and fourth portions 206c and 206d connect the first portion 206a and the second portion 206b. The fifth portion 206e crosses the pixel region P along the first direction and contacts the second portion 206b in the pixel region P. The fifth portion 206e is also connected to another second portion 206b of a next pixel region P. The fifth portion 206e may be disposed near by the thin film transistor T.

When a liquid crystal panel is completely manufactured and there is no opened data line, the first, second, third, fourth and fifth portions 206a, 206b, 206c, 206d and 206e function as a common line receiving a common signal. When one of the data lines 226 is open, the first, third and fourth portions 206a, 206c and 206d are used as a repair line, and the second and fifth portions 206b and 206e are used substantially as a common line.

Accordingly, the common signal can be transmitted to all the pixel regions P, and there is no difference between charging properties of the pixel regions P. Differences in an image can be minimized and lowering the image quality can be solved.

A method of manufacturing an array substrate for an LCD device according to the third embodiment will be described hereinafter with reference to FIGS. 9A to 9H. FIGS. 9A to 9H are cross-sectional views of illustrating an array substrate in process of manufacturing the same according to the third embodiment of the present invention. FIGS. 9A to 9H correspond to the line VII-VII of FIG. 8.

Figure 9A:
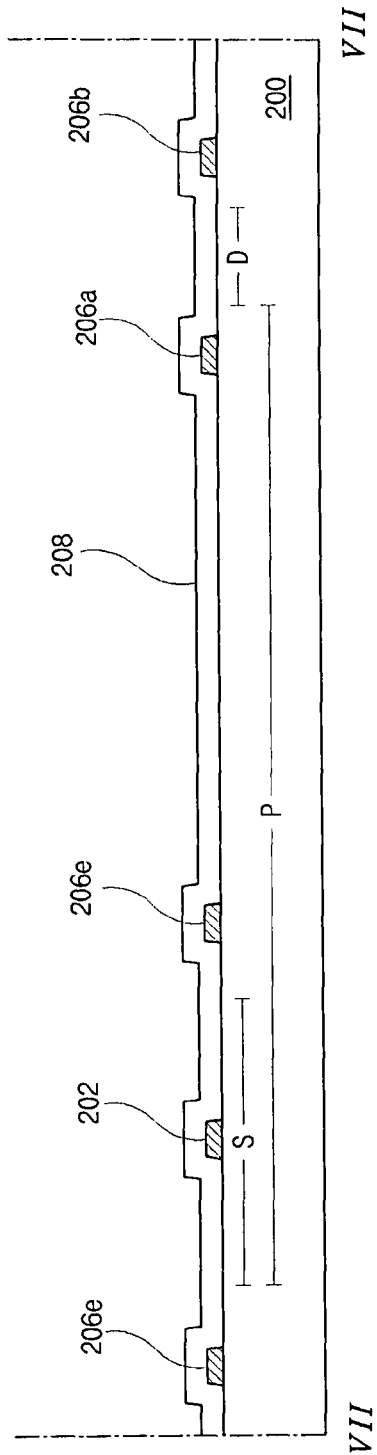
FIGS. 9A to 9H are cross-sectional views of illustrating an array substrate and a process of manufacturing the same according to the third embodiment of the present invention.

FIG. 9A shows a first mask process. In FIG. 9A, a pixel region P, a switching region S and a data region D are defined on a substrate 200. The pixel region P may include the switching region S.

A metallic material is deposited on the substrate 200 including the switching region S, the pixel region P and the data region D and then patterned by a first mask process, thereby forming a gate electrode 202 and a gate line 204 of FIG. 8. The gate electrode 202 corresponds to the switching region S and receives signals from the gate line 204 of FIG. 8. A common line is simultaneously formed with the gate electrode 202 and the gate line 204 of FIG. 8. The common line includes first, second, third, fourth and fifth portions 206a, 206b, 206c of FIG. 8, 206d of FIG. 8 and 206e. The first and second portions 206a and 206b are disposed at opposite sides of the pixel region P adjacent to the gate line 204 of FIG. 8. The third and fourth portions 206c and 206d of FIG. 8 connect the first and second portions 206a and 206b adjacent to each other. The fifth portion 206e is connected to the second portion 206b and a second portion 206b of another pixel region adjacent to the pixel region P.

The metallic material may be one or more selected from a conductive metallic group including chromium (Cr), molybdenum (Mo), tungsten (W), aluminum (Al), aluminum alloy such as aluminum nitride (AlNd), copper (Cu) and titanium (Ti).

A gate insulating layer 208 is formed substantially on an entire surface of the substrate 200 including the gate electrode 202 and the gate line 204 of FIG. 8. The gate insulating layer 208 may be formed by depositing an inorganic insulating material including silicon nitride (SiNx) or silicon oxide ($SiO_2$) or an organic insulating material including benzocyclobutene (BCB) or acrylic resin.

FIGS. 9B to 9F show a second mask process.

Figure 9B:
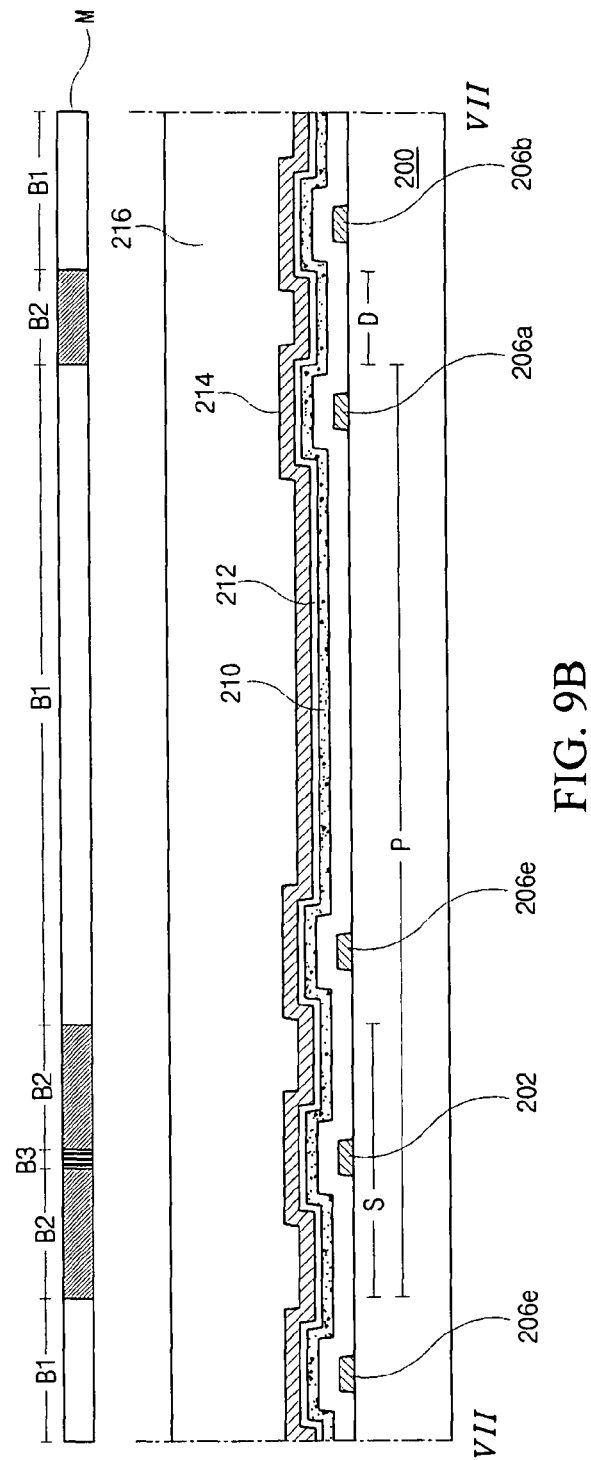

In FIG. 9B, an intrinsic amorphous silicon (a-Si:H) layer 210, an impurity-doped amorphous silicon (n+ or p+a-Si:H) layer 212 and a conductive metallic layer 214 are sequentially deposited on a substantially entire surface of the substrate 200 including the gate insulating layer 208. The conductive metallic layer 214 may be formed by depositing one or more selected from the above-mentioned conductive metallic group.

Next, a photoresist layer 216 is formed substantially on an entire surface of the substrate 200 including the conductive metallic layer 214 by applying photoresist. A mask M is disposed over the photoresist layer 216. The mask M includes a light-transmitting portion B1, a light-blocking portion B2 and a light-half transmitting portion B3. More particularly, the light-half transmitting portion B3 and the light-blocking portion B2 correspond to the switching region S such that the light-blocking portion B2 is disposed at both sides of the light-half transmitting portion B3, wherein the light-half transmitting portion B3 corresponds to the gate electrode 202. The light-blocking portion B2 also corresponds to the data region D. The light-transmitting portion B 1 corresponds to other regions except for the switching region S and the data region D. The light-half transmitting portion B3 may be semi-transparent to partially transmit light incident on the light-half transmitting portion B3, or may include slits to decrease by diffraction the intensity of light passing therethrough.

The photoresist layer 216 is exposed to light through the mask M and then is developed.

Figure 9C:
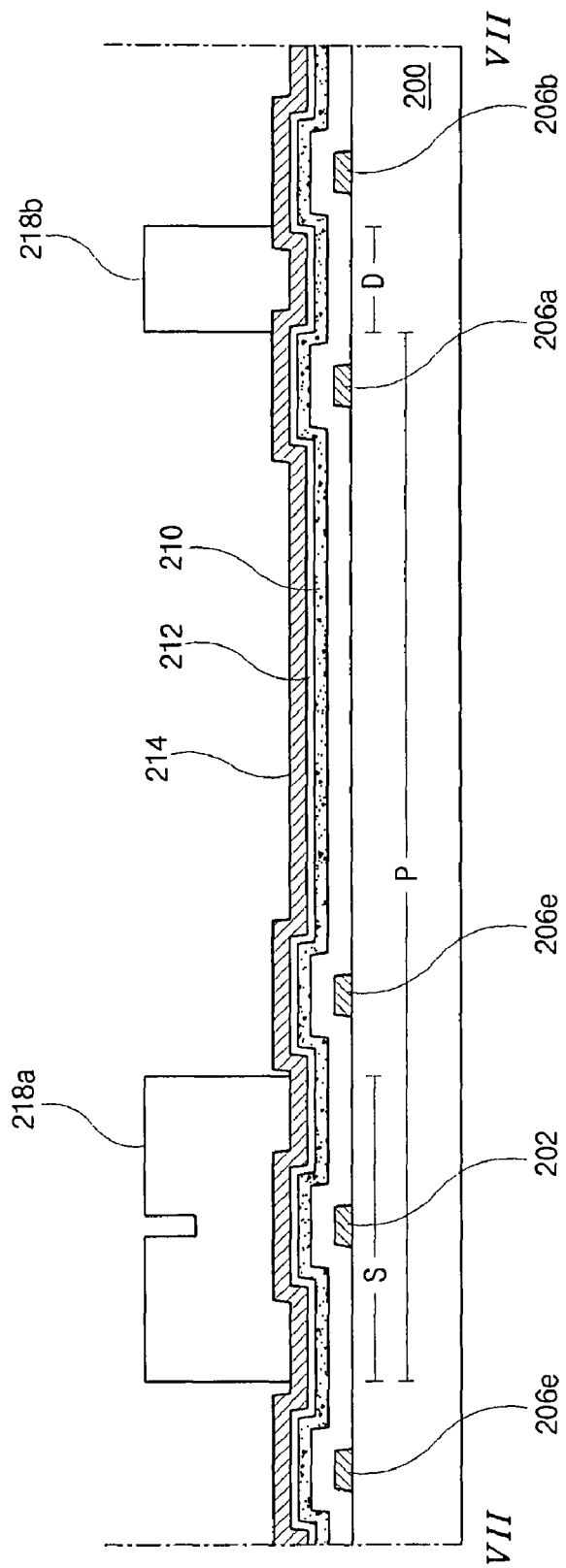

In FIG. 9C, a first photoresist pattern 218a and a second photoresist pattern 218b are formed to expose the conductive metallic layer 214. The first photoresist pattern 218a has a first part and a second part in the switching region S. The first part corresponds to the gate electrode 202, and the second part is thicker than the first part. The second photoresist pattern 218b is disposed in the data region D. The second photoresist pattern 218b has substantially the same thickness as the second part of the first photoresist pattern 218a.

Then, the exposed conductive metallic layer 214, the impurity-doped amorphous silicon layer 212 and the intrinsic amorphous silicon layer 210 are selectively removed. The conductive metallic layer 214 may be wet-etched, and the impurity-doped amorphous silicon layer 212 and the intrinsic amorphous silicon layer 210 may be dry-etched. Alternatively, if the conductive metallic layer is formed of a material that can be dry-etched, all the layers 214, 212 and 210 may be dry-etched at a time.

Figure 9D:
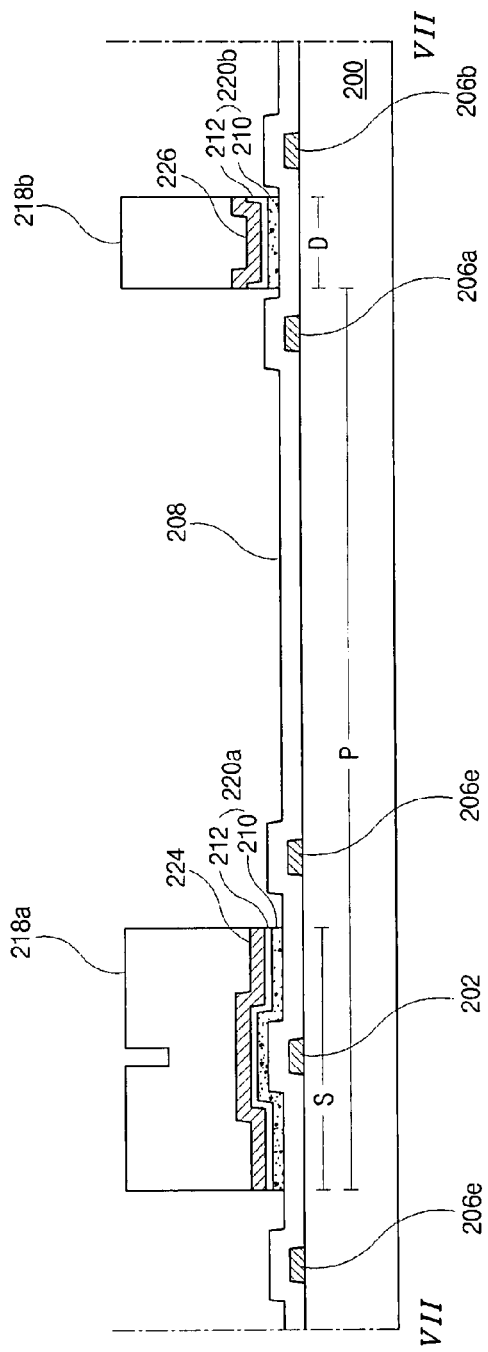

In FIG. 9D, a source-drain metallic layer 224 and a first semiconductor layer 220a are formed under the first photoresist pattern 218a, and a data line 226 and a second semiconductor layer 220b are formed under the second photoresist pattern 218b. Each of the first and second semiconductor layers 220a and 220b includes the intrinsic amorphous silicon layer 210 and the impurity-doped amorphous silicon layer 212. The data line 226 is connected to the source-drain metallic layer 224. The data line 226 crosses the gate line 204 of the FIG. 8.

An ashing process is carried out to remove the first part of the first photoresist pattern 218a corresponding to the gate electrode 202.

Figure 9E:
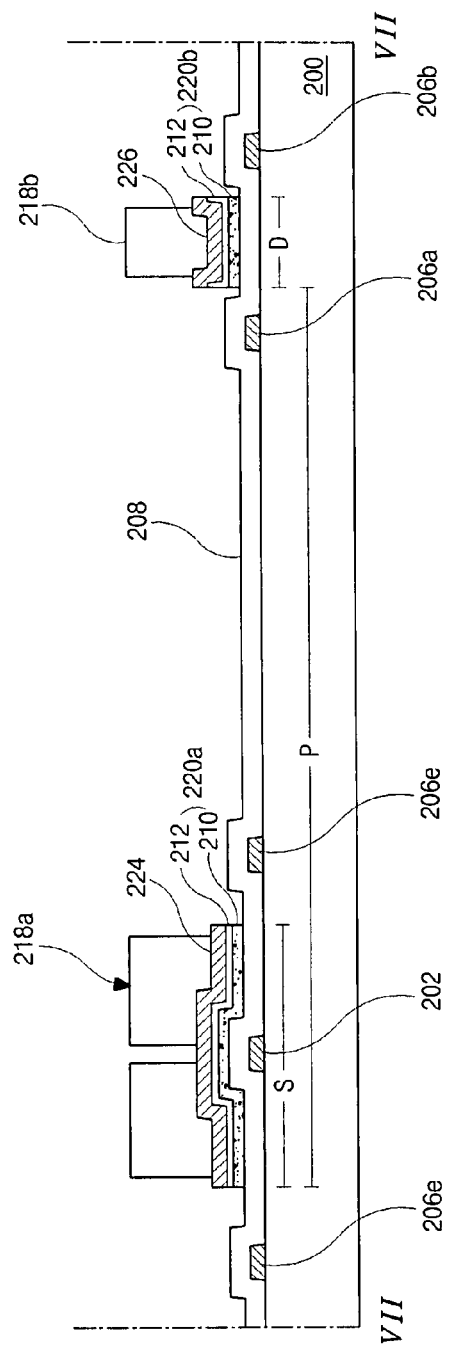

In FIG. 9E, the first photoresist pattern 218a has two parts that spaced apart from each other, which are substantially the second part, and the source-drain metallic layer 224 is exposed. The second part of the first photoresist pattern 218a and the second photoresist pattern are also removed in part and have a decreased thickness.

Further, edges of the first and second photoresist patterns 218a and 218b are removed, and thus peripheries of the source-drain metallic layer 224 and the data line 226 are exposed.

Next, the exposed source-drain metallic layer 224 and the impurity-doped amorphous silicon layer 212 are removed.

Figure 9F:
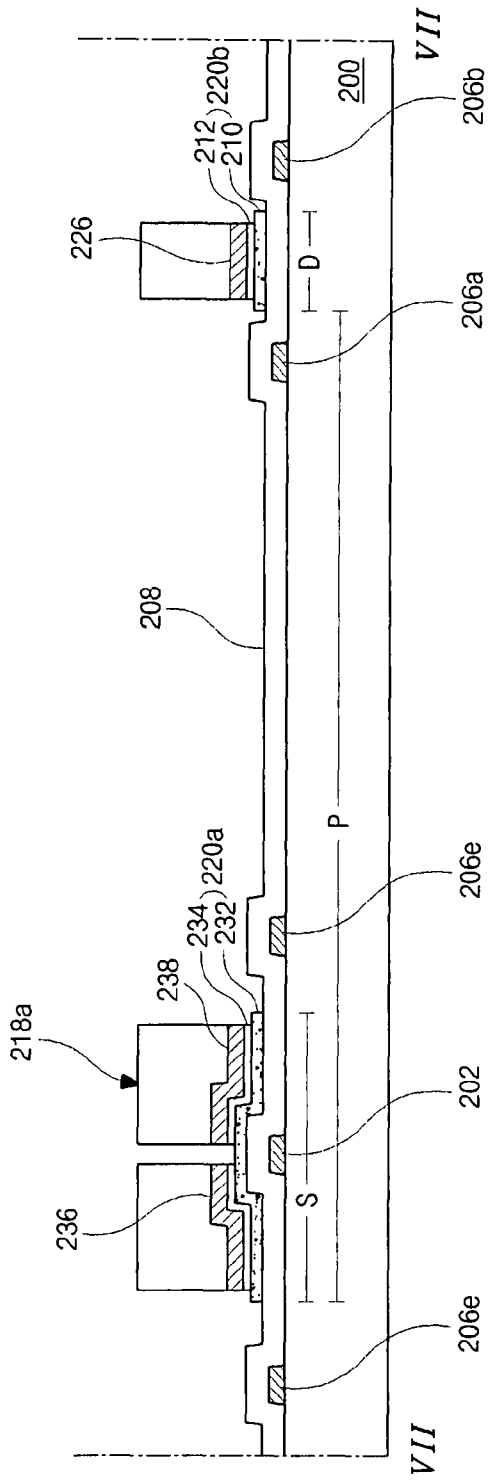

In FIG. 9F, source and drain electrodes 236 and 238 are formed over the gate electrode 202 and spaced apart from each other, and ohmic contact layers 234 are formed under the source and drain electrodes 236 and 238. The intrinsic amorphous silicon layer 210 of FIG. 9E becomes an active layer 232 under the ohmic contact layers 234. A periphery of the active layer 232 is exposed beyond edges of the ohmic contact layers 234 and the source and drain electrodes 236 and 238. In addition, a periphery of the intrinsic amorphous silicon layer 210 of the second semiconductor layer 220b is exposed beyond edges of the data line 226 and the impurity-doped amorphous silicon layer 212.

Then, the first and second photoresist patterns 218a and 218b are removed.

Figure 9G:
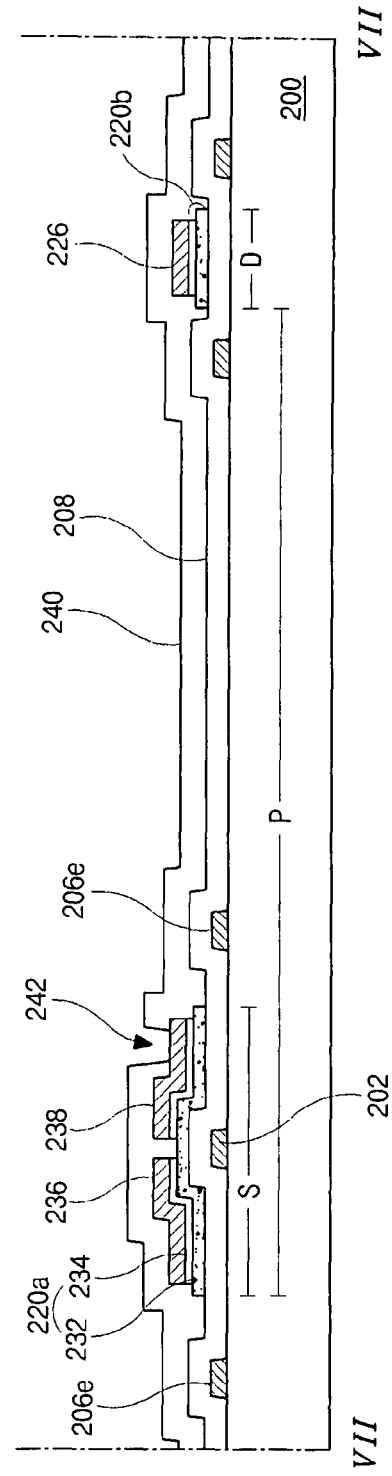

FIG. 9G shows a third mask process. In FIG. 9G, an inorganic insulating material is deposited on or an organic insulating material is applied to substantially an entire surface of the substrate 200 including the source and drain electrodes 236 and 238 and the data line 226 to form a passivation layer 240. The passivation layer 240 is patterned by a third mask process to form a drain contact hole 242 partially exposing the drain electrode 238. The inorganic insulating material may be selected from an inorganic insulating material group including silicon nitride (SiNx) and silicon oxide ($SiO_2$). The organic insulating material may be one or more selected from an organic insulating material group including benzocyclobutene (BCB) and acrylic resin.

Figure 9H:
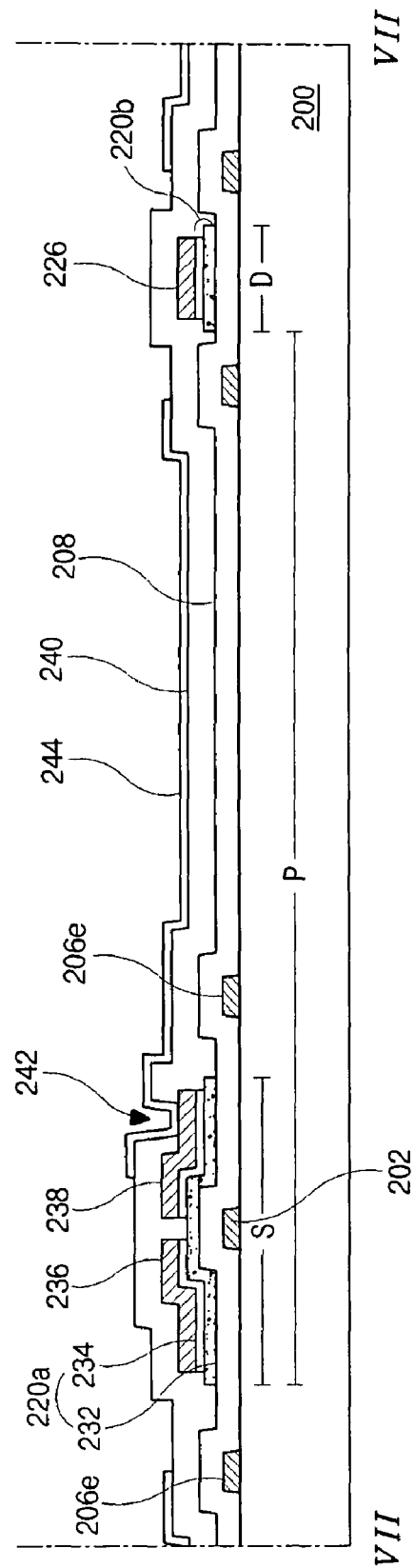

FIG. 9H shows a fourth mask process. In FIG. 9H, a transparent conductive material is deposited substantially on an entire surface of the substrate 200 including the passivation layer 240 and then patterned by a fourth mask process to form a pixel electrode 244. The pixel electrode 244 is disposed at the pixel region P. The pixel electrode 244 contacts the drain electrode 238 through the drain contact hole 242. The transparent conductive material may be one selected from a transparent conductive material group including indium zinc oxide (IZO) and indium tin oxide (ITO).

According to the present invention, in a pixel region, a part of a common line is used for repairing an opened data line, and other parts of the common line are still used for delivering a common signal. There is no difference between charging properties of pixels, and a high quality LCD device can be achieved.

It will be apparent to those skilled in the art that various modifications and variations can be made in the array substrate for a liquid crystal display device and a method of manufacturing the same of the present invention without departing from the spirit or scope of the invention. Thus, it is intended that the present invention cover the modifications and variations of this invention provided they come within the scope of the appended claims and their equivalents.

What is claimed is:

1. An array substrate, comprising: a substrate; a plurality of gate lines on the substrate; a plurality of data lines crossing the gate lines to define a plurality of pixel regions; a plurality of thin film transistors connected to the gate and data lines; a plurality of pixel electrodes in each of the plurality of pixel regions; and a plurality of common electrodes associated with each pixel region, each common electrode including first, second, third, fourth and fifth portions, wherein the first and second portions are respectively disposed at opposite sides of each of the plurality of data lines, each of the third and fourth portions is connected to the first and second portions, and the fifth portion is connected to the second portion and extends from one pixel region into a next pixel region adjacent to the one pixel region, wherein the fifth portion is spaced apart from the first portion in the one pixel region, and from the first portion in the next adjacent pixel region.

2. The array substrate according to claim 1, wherein the fifth portion is directly connected to the second portion of the common electrode associated with the next pixel region.

3. The array substrate according to claim 1, wherein each of the thin film transistors includes a gate electrode connected to one of the gate lines, an active layer over the gate electrode, ohmic contact layers over the active layer, a source electrode connected to the one of data lines, and a drain electrode spaced apart from the source electrode over the ohmic contact layers.

4. The array substrate according to claim 3, further comprising a semiconductor layer under each of the data lines, wherein the semiconductor layer includes layers extending from the active layer and one of the ohmic contact layers.

* * * * *